(12) United States Patent
Stirrat et al.

(10) Patent No.: US 6,907,378 B2
(45) Date of Patent: Jun. 14, 2005

(54) EMPIRICAL DATA BASED TEST OPTIMIZATION METHOD

(75) Inventors: Susan Stirrat, Windsor, CO (US); Kang Wu, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 196 days.

(21) Appl. No.: 10/255,480

(22) Filed: Sep. 26, 2002

(65) Prior Publication Data

US 2004/0061517 A1 Apr. 1, 2004

(51) Int. Cl.[7] .............................................. G06F 19/00
(52) U.S. Cl. ..................... 702/119; 702/84; 702/108; 700/121
(58) Field of Search ......................... 702/84, 108, 119; 700/121; 714/5–7, 703, 723, 724, 726, 736, 738; 324/765, 73.1; 365/200, 201

(56) References Cited

U.S. PATENT DOCUMENTS

| | | | | |
|---|---|---|---|---|
| 5,768,290 A | * | 6/1998 | Akamatsu | 714/732 |
| 5,771,243 A | * | 6/1998 | Lee et al. | 714/738 |
| 5,844,909 A | | 12/1998 | Wakui | |
| 6,138,257 A | * | 10/2000 | Wada et al. | 714/724 |
| 6,154,714 A | * | 11/2000 | Lepejian | 702/118 |
| 6,678,623 B2 | * | 1/2004 | Koyama | 702/82 |
| 6,707,313 B1 | * | 3/2004 | Rohrbaugh et al. | 324/765 |
| 6,792,373 B2 | * | 9/2004 | Tabor | 702/108 |
| 2002/0034112 A1 | * | 3/2002 | Kato et al. | 365/201 |
| 2004/0138846 A1 | * | 7/2004 | Buxton et al. | 702/108 |

OTHER PUBLICATIONS

Anna M. Brosa and Joan Figueras, On Maximizing the coverage of catastrophic and parametric faults, Test Workshop 1999, Proceedings, European Constance, Germany May 25–28, 1999, Los Alamitos, CA, USA, IEEE Computer Society, pp. 123–128.

Oliver Coudert, On Solving Covering Problems, Logic Synthesis, Proceedings of the 33rd. Design Automation Conference 1996. Las Vegas, Jun. 3–7, 1996, Proceedings of the Design Automation Conference, New York, IEEE, US, vol. Conf. 33, pp. 197–202.

Farzan Fallah, Stan Liao, & Srinivas Devadas, Solving Covering Problems Using LPR–Based Lower Bounds, IEEE Tranactions on very large scale integration (VLSI) Systems, IEEE Inc. New York, US, vol. 8, No. 1, Feb. 2000 pp. 9–17.

* cited by examiner

*Primary Examiner*—Carol S. W. Tsai

(57) ABSTRACT

A test method for the detection of redundant tests and inefficient tests (RITs) used for testing integrated circuits (ICs) and a subsequent optimization of test complexity and test time duration. Empirical data from an execution of all tests of interest in a test plan, flow or suite of tests is collected. The empirical data is collected without stopping at errors. This empirical data is then used to determine the identity of one or more redundant and/or inefficient tests in the test plan. In order to reduce testing time and optimize the test flow, one of more of the following occurs. Redundant tests may be selectively removed, inefficient tests may be re-ordered to allow more efficient tests to be executed earlier in the test flow of the ICs, or some combination of this. RIT information is thus used to optimize the test flow, resulting in a reduction in test complexity and in test duration.

23 Claims, 3 Drawing Sheets

EMPIRICAL DATA BASED TEST OPTIMIZATION METHOD

TECHNICAL FIELD

This invention relates generally to the field of integrated circuit testing, and more specifically to the detection of defects in integrated circuits using a highly efficient test planning methodology.

BACKGROUND OF THE INVENTION

An important aspect of the manufacture of integrated circuits (IC's) is the post-production testing process of ICs that have been manufactured in silicon. The goal of the post-production testing process is to apply test inputs to one or more IC devices, such as those resident while still on the die, and determine if the device or devices being testing is defective. Preferably, this defect detection process occurs early in the manufacturing process, in order to prevent or correct as soon as possible the integration or inclusion of faulty IC components and/or devices into devices and/or systems. Identifying faulty IC devices for removal obviously becomes more expensive the more integrated such devices become in constituent devices or systems. Consider, for example, the difficulty that most probably would be attendant with attempting to determine the location of a faulty IC in a personal computer system. It is obviously much easier, and thus less costly, to identify and remove this faulty IC before it has been integrated into the PC.

There are several different kinds of tests that can be applied to IC defect testing. Exhaustive tests seek to apply every possible input to the device in order to determine if any defects are present in the IC. Functional testing tests the functional features of an IC to verify correct operation. The fault model test determines each type of fault that is likely to occur with a particular IC, and the accordingly devises tests to uncover any of these common faults that might be present. The exhaustive test can be the most time-consuming type of IC test and may also be quite expensive. Functional testing is problematic in that the test design must accurately ensure that all functionality is correctly tested. Functionality testing requires application-specific knowledge to ensure that all incorporated functionality has been tested. Fault modeling testing will detect the faults assumed as part of the testing framework of the fault model. An example of the fault model is the stuck-at fault model. This model might assume a limited number of faults and assume that these faults are permanent. Other types of tests include, but are not limited to, electrical connectivity (testing such parameters as voltage, current, resistance, and inductance levels as different signals are applied to the IC device), circuit functional testing, device function, vector testing, vector-less testing, IDDQ testing in which the current required to run a vector is examined, and scanning testing (such as boundary scanning). It is further noted that IC testing may be commonly performed at the die level, prior to packaging of the IC.

A well-designed test plan preferably tests a given IC function or faulty condition once, thereby allowing the test plan, also referred to as a test suite, suite of tests, or test flow, or some portion thereof, to execute the test sequences of one or more tests of the test plan in an efficient fashion and minimize the amount of time required to execute the test sequence and obtain the test results. However, because the exhaustive, functional, and fault model approaches are based upon register transfer level (RTL), physical layouts, and schematics, the relationship between the manufacture process and the physical layout of the IC is not exploited in the test strategy. The lack of relation between the physical layout and the manufacture process make these testing methods susceptible to repeating the same test sequence more than once, thereby resulting in test inefficiencies. The number of redundant tests and inefficient tests (RITs) is therefore a valuable parameter to consider when designing test plans, since there is a strong benefit in terms of reducing test complexity and test execution time when the number of RITs are reduced. Current strategies, however, seek to eliminate the execution of redundant tests in the IC testing process using the same exhaustive, functional, and fault model strategies used in standardized IC testing, without taking into account the presence of any relationship between the physical layout of the device and the manufacturing process. There is thus an unmet need in the art for an IC testing strategy that takes less time than currently used defect detection strategies, is less computationally intensive, and does not need to be based upon RTL, physical layout, and schematics.

SUMMARY OF THE INVENTION

The test detection method of the present invention uses empirical data gathered during a preliminary execution of all tests in a test plan, suite or flow without stopping at testing errors that might be generated. This empirical data is used to infer the relation between the physical layout of the IC and the manufacture process. This empirical data can then be analyzed to detect the occurrence of one or more RITs in the tests of the test plan. In order to reduce testing time, redundant tests may be selectively removed and efficient tests selectively re-ordered in the test flow so that redundant tests are not executed and efficient tests are executed earlier in the IC test flow. Thus, the RIT information is used to optimize the test flow.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
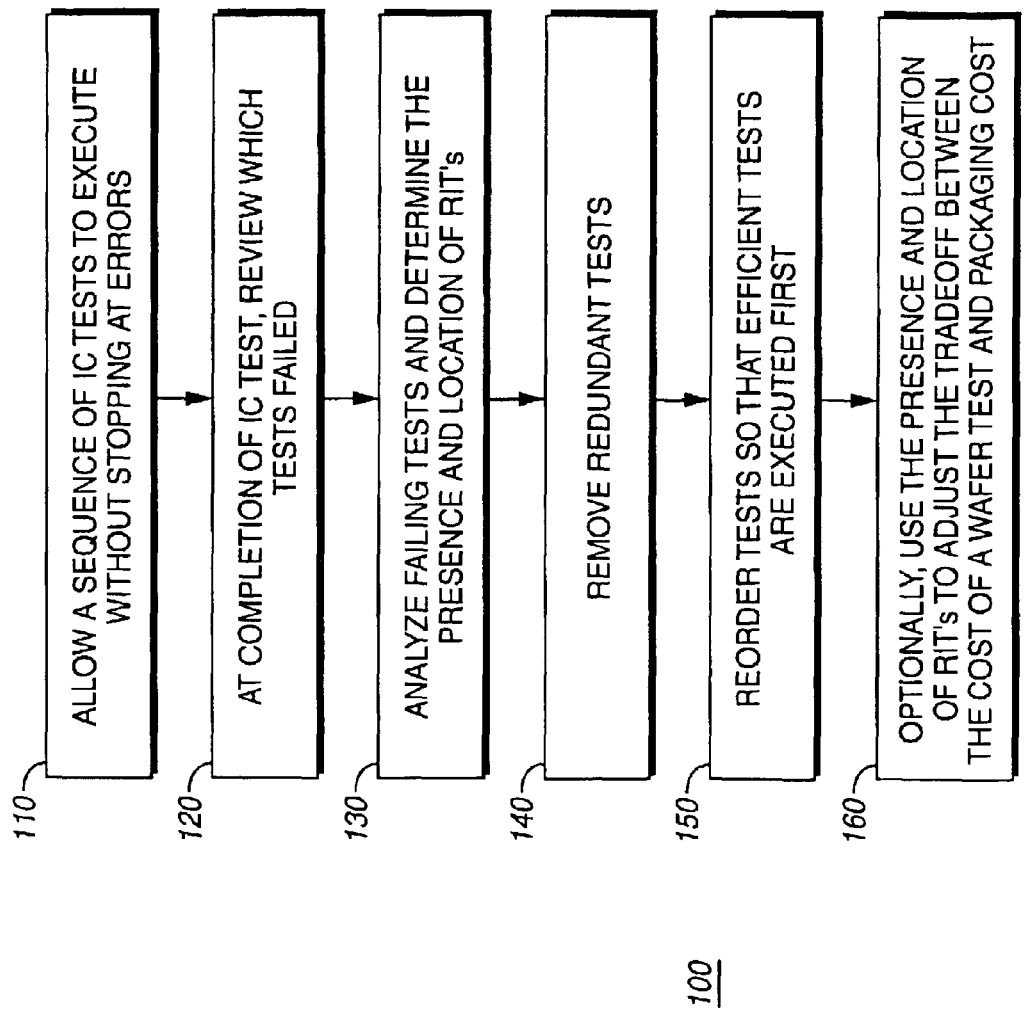
FIG. 1 is a flow diagram of the RIT detection method, according to an embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

The present invention reduces the amount of test time required to test ICs by seeking to eliminate redundancy and increase the efficiency of testing of one or more ICs, which have been manufactured in silicon, by one or more tests of a test flow, test plan or suite of tests. Rather than stopping, collecting and analyzing test results after each test of a suite of tests has been performed, the tests of the test flow are executed in their sequenced order on a large number of ICs, such as the die that might be embodied on one or more wafers, and when the testing of the test suite, or some portion of interest thereof, is completed, the empirical data collected from execution of each of the tests in the flow are analyzed following completion of the suite of tests, thereby allowing for a full analysis of all potential RITs in the test suite at the earliest possible time. The empirical data that is collected is statistically significant because the unimproved test sequence tests a large enough number of ICs to generate meaningful pass/fail test result information. This, in itself, is an improvement in that a true picture of the test flow problems, i.e. RITs, of a particular suite of tests is determined much more quickly than looking at IC failures as they occur, on a test-by-test basis. The advantage of this approach is further illustrated when one considers that for an IC device under test of any complexity to be adequately exercised, it may necessarily have to be subjected to a large number of independent tests in a test suite; it is not uncommon for an IC of any complexity, such as a microprocessor or controller chip, to be subjected to testing by hundreds or even thousands of discrete tests. Much time is saved if tests of such a test flow are executed and then optimized prior to running the improved or optimized test flow on many devices.

Any type of IC circuit, structure or device in silicon may be tested using the method of the present invention, including, but not limited to, microprocessors, controller chips, etc. The present invention works especially well with ICs under test that have a large variety of circuitry, thereby mandating that various types of tests be run on them to prove out their suitability.

Waiting until a full complement of empirical data is obtained for the entire, or a portion of the entire, test flow or suite to be optimized allows for the best analysis of the test suite to occur in the fastest time. The quality and quantity of the empirical data analyzed can be important to optimization of the test flow. Again, the unoptimized test flow or suite will be executed to test a large enough number of ICs to generate statistically meaningful test results (pass/fail information). At least two issues that may be analyzed from the empirical data include redundancy and efficiency. As will be clear from the following description, the characterization of a test in a test flow or suite as a redundant or inefficient test (RIT) can be colored by the amount of data that is analyzed.

Redundancy in test flows contributes to increased test time and inefficiency of the flow, and is to be avoided. There is not often a need to repeat a test in a test flow that exercises the IC under test in the same manner. It may be said that any subsequent and substantially identical test to an initial test in the test flow is redundant if performing such subsequent test does not provide a benefit (such as robustness) and uses up valuable test time without corresponding benefit. In addition to two tests performing the same defect checking, redundancy may also be defined in other ways.

Consider, by way of example, the following, two separate tests of a test flow. Test 1 might detect Defect 1 and Test 2 detect Defect 2. If these two defects, Defect 1 and Defect 2, always occur together, meaning that if one defect is detected it can be assumed that the other one exists as well, however, Tests 1 and 2 are redundant of each other. It would make sense to delete one of these tests from the test flow, such as the slower of these tests, assuming that the test to be deleted does not contribute in some other fashion to the testing of the IC device. Another consideration would be to keep the test in the flow that might also test for other types of defects. A further example of redundancy is illustrated by the following. Consider the situation in which if Test 1 and Test 2 fail, then Test 3 will also always fail. If during the initial execution of the tests of the test flow, Test 1 and Test 2 fail then it is known that Test 3 will fail and it can therefore be eliminated from the test flow.

Eliminating redundancy in the test flow improves the time required for subsequent executions of the suite of tests. It can further be seen that eliminating redundant tests from a test flow is best performed after the entire flow of interest, whether that be an entire suite of tests or a portion thereof, has been executed, after which time a more complete picture of all redundant tests may be obtained. For example, test E executed as test number five in a given test flow may be redundant to test A, the first test in the test flow, but the redundancy of test E will not be appreciated until it is executed. Thus, performing an analysis of the test flow that only looks at the first four tests, for instance, would be incomplete insofar as it would not yet take into account the redundancy of test E.

In addition to redundancy, another negative characteristic of test flow is inefficiency. A comparative analysis that looks at the comparative performance of various tests in the test flow or suite with respect to one or more relevant criteria is used to determine efficiency and inefficiency, its counterpart, of a particular test. The criteria used to evaluate relative inefficiency vary and should be chosen in accordance with the characteristics of interest in optimizing the test suite. Criteria envisioned include, but need not be limited to, time, test coverage, import of test (qualitatively and/or quantitatively), or some combination thereof. Consider the following examples. If two tests in a test sequence test for the same defect, the faster test might be considered more efficient and the test sequence would benefit from re-ordering it to place the faster test earlier in sequence than the slower test. Test A that only tests for defect 1 is considered to be less efficient than Test B that tests for defects 1, 2 and 3 and thus the test sequence should be re-ordered, if needed, so that Test B is executed before Test A. Executing Test B prior to Test A will provide more information sooner about the ability of the IC under test to pass/fail defect tests.

Table 1 below also illustrates some of the concepts of efficiency based upon various criteria. In this example, three tests of a test flow or suite of tests, Test 1, Test 2, and Test 3, which are executed sequentially in the order indicated, are being analyzed for efficiency vis-à-vis each other. Also in this example, four ICs, each in die format and referred to as Die 1, Die 2, Die 3, and Die 4, respectively, are being tested by the test flow having Tests 1, 2, and 3. "X" indicates that whether the IC die under test has failed a particular test in the test flow; this result has been obtained after executing the test flow of Tests 1, 2, and 3 on ICs under test Die 1, 2, 3, and 4.

TABLE 1

|  | TEST 1 (tests for 2 defects) | TEST 2 (tests for 4 defects, slowest) | TEST 3 (tests for 2 defects, fastest) |
| --- | --- | --- | --- |
| DIE 1 |  | X | X |
| DIE 2 | X |  | X |
| DIE 3 | X | X |  |
| DIE 4 |  | X |  |

Test 2 in Table 1 might be considered to be the most efficient test, even though it is the slowest, if the measurement criteria of efficiency is quantity and quality of data returned; it can be seen that three of the four die tested failed Test 2. And, if it is not appreciably slower than Test 1 or Test 3, Test 2 may effectively also be the fastest test when one considers that it tests for four types of defects, double the number of the other two tests. Conversely, if the measurement criterion is speed, then Test 3 is the most efficient test since it is the fastest and thus would be re-ordered to be the test that is executed first, if it is not so already. The measurement of efficiency may be qualitative in nature and thus might yield a different re-ordering of the tests. Suppose that the Test 1, while testing for only two defects tests for the two defects considered to be the most important for the type of Dies being tested. In this case, Test 1 could be considered to be more efficient than Test 3, for even though it is slower, the test results that it will generate are more meaningful than those generated by Test 3 and thus it would be better to have them earlier in the testing process. These considerations would argue for re-ordering the test flow to ensure that Test 1 continues to be executed prior to Test 3. Or, Test 1 could be considered to be the most efficient test if a defect that both Test 2 and Test 3 test for becomes irrelevant or of diminished import. This would effectively mean that Test 2 tests for only three defects and Test 3 for only one defect. The relative speed by which Test 3 executes its testing of the dies would be of diminished importance vis-à-vis the two more important defect tests performed by Test 1 at the slower rate. Again, the need to know the results of the testing performed by Test 1 in a timely manner, would argue for keeping this test earlier in the test flow, before execution of Tests 2 or 3, in this particular example.

Again, the determination of which tests of a test suite or portion of interest thereof, are inefficient, being a comparative analysis, is, like the determination of redundant tests, a pursuit best left performed on as much data as possible. Thus, the present invention executes all the tests of interest in a test suite or portion thereof to obtain the empirical test results data on which the analysis is performed. And, it has been found that the invention works particularly well when a large number of dies or die lots have been tested, so as to provide a statistically significant volume of empirical test data. The number of dies to be tested itself may otherwise be a function of many different variables, such as IC complexity, metallization layers, number of tests in the test flow, etc.

Identification of test inefficiency permits the re-ordering of the sequence of tests of the test flow or suite and is an important tool for optimizing the test flow. Depending upon the criterion or criteria used to measure efficiency, re-ordering tests in the test flow to promote efficiency can improve testing in a number of ways. Re-ordering the sequence of tests in the test suite to put faster tests before slower ones can yield a faster test flow that provides test results more quickly, for instance, whereas placing a test capable of testing for three defects before a test capable of testing only one defect yields a test flow that provides better quantitative and qualitative test results earlier.

Referring now to FIG. 1, a block flow diagram of an exemplary RIT test detection technique 100 is shown according to an embodiment of the present invention. This technique collects RIT test information, the empirical test data, by first allowing an initial set of IC tests of a test flow or suite of tests to execute without stopping at any failure detections (block 110). Enough ICs are exercised by the initial test flow to generate statistically significant test results, such as pass/fail information, about RITs that exist in the flow. At the completion of execution of the initial set of IC tests, a review of the empirical data collected during execution of the tests of the test suite is made to determine which of those tests failed (block 120). Those tests that failed are analyzed to determine the possible presence and location of redundant and inefficient tests (block 130); location of a test in the test flow refers to where in the test flow the test is chronologically placed. Any redundant tests are removed (block 140), and the remaining tests in the initial test plan are re-ordered so that efficient tests are executed first (block 150) in an optimized test flow. The optimized test flow can then be used to more efficiently test a large number of the ICs. It is noted here that the ICs exercised by the improved test flow or suite are probably different from the ICs used to generate the empirical test data of the original test flow, since it will usually not be necessary to re-test these circuits.

As previously noted in the foregoing description, test optimization may occur with either or both of Blocks 140 and 150. In other words, optimization of a test flow may be accomplished by only removing one or more redundant tests (in which case block 150 would not be performed), by only re-ordering one or more tests in accordance with determined efficiencies (in which case block 140 would not be performed), or a combination of the two approaches. Finally, it is an option to use location of the RITs within the initial test plan to adjust between a cost of a IC wafer test and a packaging cost of an IC (block 160), to balance the tradeoff between the cost of wafers tested and the packaging cost. That is, lowering the cost of a wafer test is likely to increase the packaging cost of an IC, while decreasing the packaging cost of an IC is likely to increase the cost of wafer testing assuming other test factors remain the same.

The present invention reduces the amount of test time required to test ICs by seeking to eliminate redundancy and increase the efficiency of a sequence of tests, known as a test suite, that are used to test one or more ICs that have been manufactured in silicon. While the best results in reducing testing times are achieved by both eliminating redundant tests and placing the most efficient tests earliest in the test sequence, it is envisioned that both of these actions are not simultaneously required by the present invention. Improvements in testing time, although perhaps lesser, may also be achieved by focusing only on removing redundant tests from a test sequence or only on the reordering the tests of the test sequence. It is further envisioned that improvement may be realized by a combination of these two approaches, even at a less than optimal level. For instance, improvements in testing time may be achieved by removing most, but not all, of the redundant tests from a test sequence while also reordering the test sequence to put some, but not all, efficient tests earlier prior to more inefficient tests in the test sequence.

Figure 2:
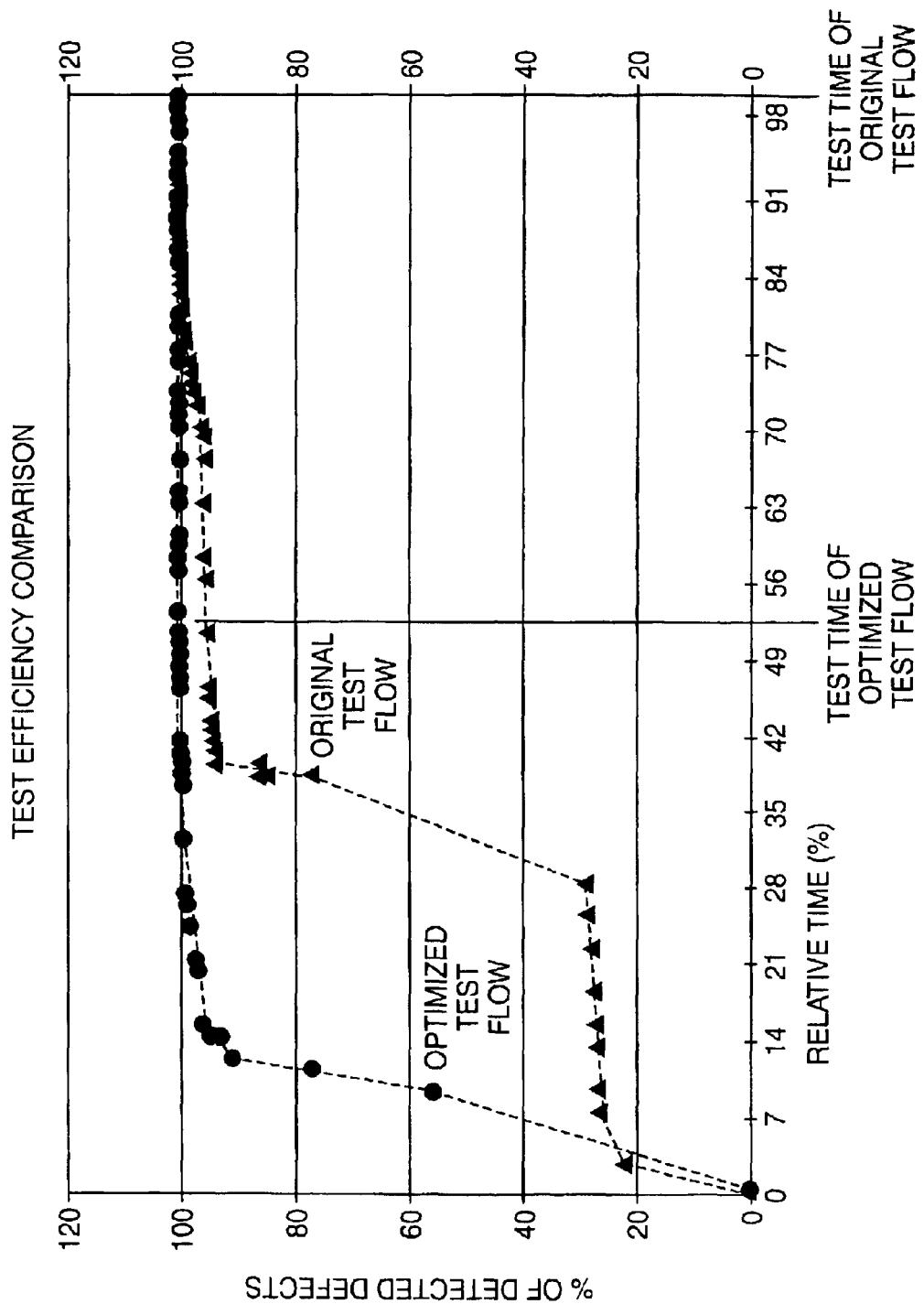
FIG. 2 is a graph illustrating test efficiency comparison between an original test flow (denoted by triangular symbols) and an optimized test flow (denoted by the circular symbols), in accordance with an exemplary embodiment.

The benefit to be realized from the present invention is shown in FIG. 2, a graph illustrating test efficiency comparison between an original test flow (denoted by triangular symbols) and an optimized test flow (denoted by the circular symbols). It has been observed that a test time reduction of 50% or more can be achieved by the process of test flow optimization through removal of redundant tests and re-ordering of tests.

Figure 3:
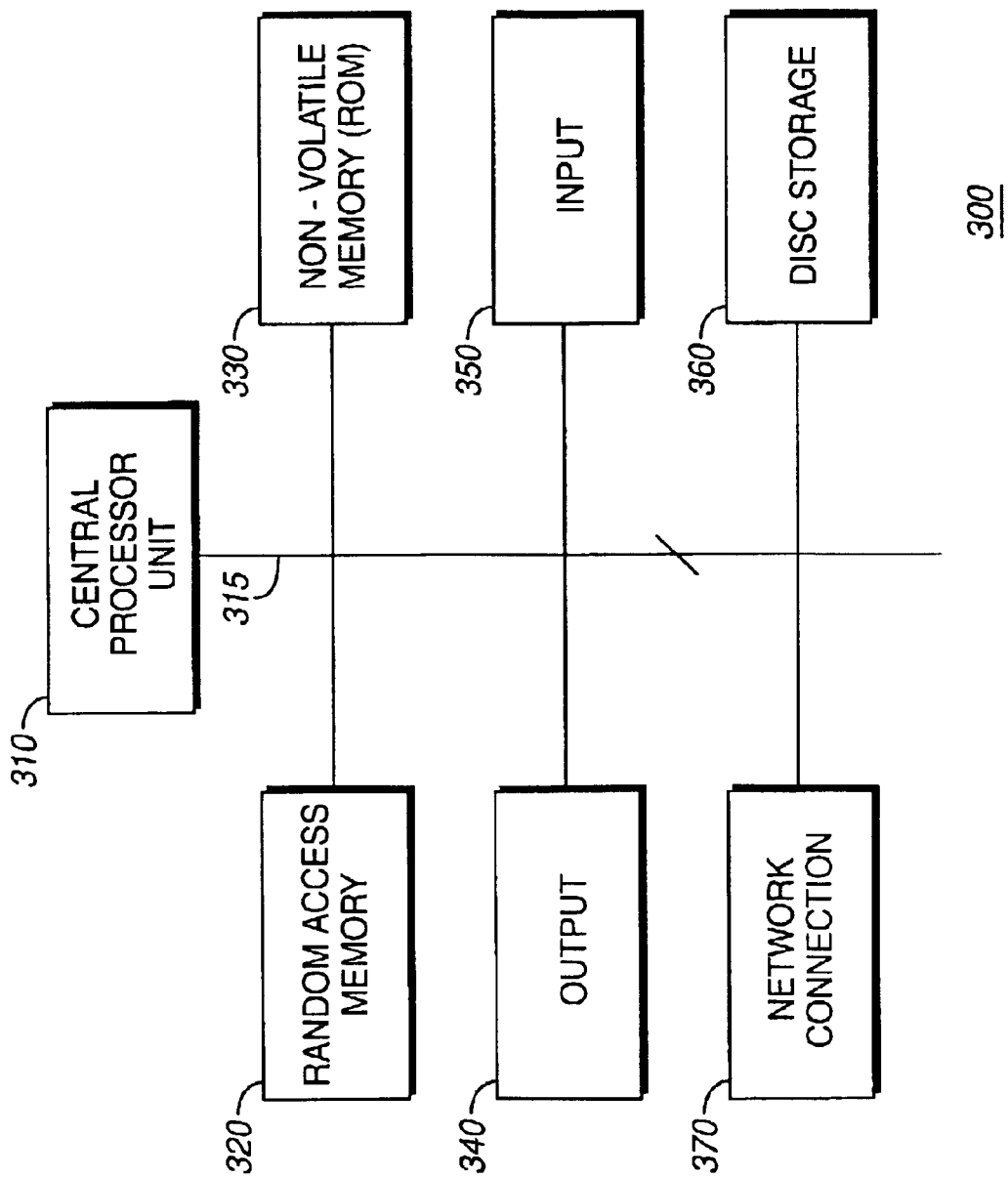
FIG. 3 is a block diagram of a computer system suitable for carrying out processes consistent with certain embodiments of the present invention.

The processes previously described can be carried out on a programmed general-purpose computer system, such as the exemplary computer system 700 depicted in FIG. 3. The methodology described above could be carried out by instructions run by any such computer or computer system, such as a IC tester machine capable of running or controlling the testing of ICs. Computer system 300 has a central processor unit (CPU) 310 with an associated bus 315 used to connect the central processor unit 310 to Random Access Memory 320 and/or Non-Volatile Memory 330 in a known manner. An output mechanism at 340 may be provided in order to display and/or print output for the computer user. Similarly, input devices such as keyboard and mouse 350 may be provided for the input of information by the computer user. Computer 300 also may have disc storage 360 for storing large amounts of information including, but not limited to, program files and data files. Computer system 300 may be coupled to a local area network (LAN) and/or wide area network (WAN) and/or the Internet using a network connection 370 such as an Ethernet adapter coupling computer system 300, possibly through a firewall.

Those skilled in the art will recognize that the present invention has been described in terms of exemplary embodiments based upon use of a programmed processor. However, the invention should not be so limited, since the present invention could be implemented using hardware component equivalents such as special purpose hardware and/or dedicated processors that are equivalents to the invention as described and claimed. Similarly, general purpose computers, microprocessor based computers, microcontrollers, optical computers, analog computers, dedicated processors and/or dedicated hard wired logic may be used to construct alternative equivalent embodiments of the present invention.

The present invention, as described in embodiments herein, is implemented using a programmed processor executing programming instructions that are broadly described above in flow chart form that can be stored on any suitable electronic storage medium or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method for optimized testing of integrated circuits (ICs), comprising:

executing a first test sequence comprising a plurality of tests to test a first plurality of integrated circuit (ICs) and to generate a statistically significant test result comprising one or more test failures, wherein executing the first test sequence does not stop as the one or more test failures of the first plurality of ICs are generated during execution of the first test sequence;

analyzing the one or more test failures to identify one or more redundant and inefficient tests (RITs) in the plurality of tests of the first test sequence; and generating a second test sequence that is optimized with respect to the first test sequence by performing at least one of removing and reordering at least one of the one or more identified RITs.

2. The method of claim 1, wherein each RIT of the one or more RITs is one of a redundant test and an inefficient test and performing at least one of removing and reordering the one or more identified RITs to generate the second test sequence further comprises for the at least one of the one or more identified RITs:

removing the RIT from the second test sequence if the RIT is a redundant test; and reordering the RIT to be executed later in the second test sequence than it was executed in the first test sequence if the RIT is an inefficient test.

3. The method of claim 1, wherein each RIT of the one or more RITs is one of a redundant test and an inefficient test and performing at least one of removing and reordering the one or more identified RITs to generate the second test sequence further comprises for each identified RIT:

removing the RIT from the second test sequence if the RIT is a redundant test; and reordering the RIT to be executed after a test of the first plurality of tests that is not one of the one or more identified RITs.

4. The method of claim 3, wherein the test that is not one of the one or more identified RITs is more efficient than the RIT.

5. The method of claim 1, wherein analyzing the one or more test failures to identify one or more redundant and efficient tests of the first test sequence further comprises:

identifying one or more redundant tests of the first test sequence; and wherein generating the second test sequence further comprises:

removing the one or more redundant tests of the first test sequence to generate the second test sequence having a plurality of tests that is fewer than the plurality of tests of the first test sequence.

6. The method of claim 1, wherein analyzing the one or more test failures to identify one or more redundant and efficient tests of the first test sequence further comprises:

identifying one or more inefficient tests of the first test sequence; and wherein generating the second test sequence further comprises:

ordering the one or more identified inefficient tests in the second test sequence to occur later in the second test sequence than they occurred in the first test sequence.

7. The method of claim 1, further comprising:

executing the second test sequence on a second plurality of ICs, wherein execution of the second test sequence may selectively stop upon generation of one or more test failures of the second plurality of ICs.

8. A method of carrying out a computer assisted function on a general-purpose computer for optimized testing of integrated circuits (ICs) in accordance with a set of instructions, comprising:

instructions for executing a first test sequence comprising a plurality of tests to test a first plurality of integrated circuit (ICs) and to generate a statistically significant test result comprising one or more test failures, wherein executing the first test sequence does not stop as the one or more test failures of the first plurality of ICs are generated during execution of the first test sequence;

instructions for analyzing the one or more test failures to identify one or more redundant and inefficient tests (RITs) in the plurality of tests of the first test sequence; and instructions for generating a second test sequence that is optimized with respect to the first test sequence by performing at least one of removing and reordering at least one of the one or more identified RITs.

9. The method of claim 8, wherein each RIT of the one or more RITs is one of a redundant test and an inefficient test and performing at least one of removing and reordering the one or more identified RITs to generate the second test sequence further comprises for the at least one of e one or more identified RITs:

instructions for removing the RIT from the second test sequence if the RIT is a redundant test; and instructions for reordering the RIT to be executed later in the second test sequence than it was execute in the first test sequence if the RIT is an inefficient test.

10. The method of claim 8, wherein each RIT of the one or more RITs is one of a redundant test and an inefficient test and performing at least one of removing and reordering the one or more identified RITs to generate the second test sequence further comprises for each identified RIT:

instructions for removing the RIT from the second test sequence if the RIT is a redundant test; and instructions for reordering the RIT to be executed after a test of the first plurality of tests that is not one of the one or more identified RITs.

11. The method of claim 10, wherein the test that is not one of the one or more identified RITs is more efficient than the RIT.

12. The method of claim 8, wherein analyzing the one or more test failures to identify one or more redundant and efficient tests of the first test sequence further comprises:

instructions for identifying one or more redundant tests of the first test sequence; and wherein generating the second test sequence further comprises:

instructions for removing the one or more redundant tests to generate the second test sequence having a plurality of tests that is fewer than the plurality of tests of the first test sequence.

13. The method of claim 8, wherein analyzing the one or more test failures to identify one or more redundant and efficient tests of the first test sequence further comprises:

instructions for identifying one or more inefficient tests of the first test sequence; and wherein generating the second test sequence further comprises:

instructions for ordering the one or more identified inefficient tests in the second test sequence to occur later in the second test sequence than they occurred in the first test sequence.

14. The method of claim 8, further comprising:

instructions for executing the second test sequence on a second plurality of ICs, wherein execution of the second test sequence may selectively stop upon generation of one or more test failures of the second plurality of ICs.

15. A method for optimized testing of integrated circuits (ICs), comprising:

executing a first test sequence comprising a plurality of tests to test a first plurality of integrated circuits (ICs) and to generate a statistically significant test result comprising one or more test failures, wherein executing the first test sequence does not stop as the one or more test failures of the first plurality of ICs are generated during execution of the first test sequence;

analyzing the one or more test failures to identify one or more redundant tests and one or more inefficient tests in the plurality of tests of the first test sequence; and generating a second test sequence that is optimized with respect to the first test sequence by removing one or more of the redundant tests from the first test sequence and reordering one or more of the inefficient tests in the first test sequence.

16. The method of claim 15, wherein reordering one or more of the inefficient tests comprises ordering the one or more inefficient tests to occur later in the second test sequence than they ocurred in the first test sequence.

17. The method of claim 15, wherein reordering one or more of the inefficient tests comprises reordering the one or more of the inefficient tests to be executed after one or more tests that are not identified as inefficient.

18. The method of claim 15, further comprising:

executing the second test sequence on a second plurality of ICs, wherein execution of the second test sequence may selectively stop upon generation of one or more test failures of the second plurality of ICs.

19. A method of carrying out a computer assisted function on a general-purpose computer for optimized testing of integrated circuits (ICs) in accordance with a set of instructions, comprising:

instructions for executing a first test sequence comprising a plurality of tests to test a first plurality of integrated circuits (ICs) and to generate a statistically significant test result comprising one or more test failures, wherein executing the first test sequence does not stop as the one or more test failures of the first plurality of ICs are generated during execution of the first test sequence;

instructions for analyzing the one or more test failures to identify one or more redundant tests and one or more inefficient tests in the plurality of tests of the first test sequence; and instructions for generating a second test sequence that is optimized with respect to the first test sequence by removing one or more of the redundant tests from the first test sequence and reordering one or more of the inefficient tests in the first test sequence.

20. The method of claim 19, wherein reordering one or more of the inefficient tests comprises instructions for ordering the one or more inefficient tests to occur later in the second test sequence than they occurred in the first test sequence.

21. The method of claim 19, wherein reordering one or more of the inefficient tests comprises instructions for reordering the one or more of the inefficient tests to be executed after one or more tests that are not identified as inefficient.

22. The method of claim 19, further comprising:

instructions for executing the second test sequence on a second plurality of ICs, wherein execution of the second test sequence may selectively stop upon generation of one or more test failures of the second plurality of ICs.

23. The method of claim 19, wherein executing the first test sequénce does not stop as the one or more test failures of the first plurality of ICs are generated during execution of the first test sequence.

* * * * *

UNITED STATES PATENT AND TRADEMARK OFFICE
CERTIFICATE OF CORRECTION

PATENT NO. : 6,907,378 B2  Page 1 of 1
APPLICATION NO. : 10/255480
DATED : June 14, 2005
INVENTOR(S) : Stirrat et al.

It is certified that error appears in the above-identified patent and that said Letters Patent is hereby corrected as shown below:

On the face page, in field (56), under "Other Publications", in column 2, line 13, delete "Tranactions" and insert - - Transactions - -, therefor.

On the face page, in field (57), under "Abstract", in column 2, line 10, after "one" delete "of" and insert - - or - -, therefor In column 9, line 18, in Claim 9, delete "e" and insert - - the - -, therefor.

In column 9, line 22, in Claim 9, delete "execute" and insert - - executed - -, therefor.

In column 10, line 18, in Claim 16, delete "ocurred" and insert - - occurred - -, therefor.

In column 10, line 63, in Claim 23, delete "sequénce" and insert - - sequence - -, therefor.

Signed and Sealed this

First Day of August, 2006

JON W. DUDAS
*Director of the United States Patent and Trademark Office*